US008227736B2

(12) United States Patent
Tseng et al.

(10) Patent No.: US 8,227,736 B2

(45) Date of Patent: Jul. 24, 2012

(54) IMAGE SENSOR DEVICE WITH SILICON MICROSTRUCTURES AND FABRICATION METHOD THEREOF

(75) Inventors: Chi-Xiang Tseng, Hsinchu (TW); I-Hsiu Chen, Taipei (TW); Chen-Wei Lu, Hsinchu (TW); Chun-Hung Lai, Taichung (TW)

(73) Assignee: VisEra Technologies Company Limited, Hsinchu (TW)

( * ) Notice: Subject to any disclaimer, the term of this patent is extended or adjusted under 35 U.S.C. 154(b) by 510 days.

(21) Appl. No.: 12/497,146

(22) Filed: Jul. 2, 2009

(65) Prior Publication Data

US 2011/0001038 A1 Jan. 6, 2011

(51) Int. Cl.
*H01L 21/00* (2006.01)

(52) U.S. Cl. ..................... 250/208.1; 250/226; 257/432; 257/440

(58) Field of Classification Search .................. 250/226, 250/208.1; 438/57, 60, 65, 70; 257/448, 257/457, 459, 440; 359/486, 590
See application file for complete search history.

(56) References Cited

U.S. PATENT DOCUMENTS

| | | | | |
|---|---|---|---|---|
| 4,818,079 | A * | 4/1989 | Maserjian | 359/299 |
| 7,858,921 | B2 * | 12/2010 | Stanton et al. | 250/226 |
| 7,880,255 | B2 * | 2/2011 | Baggenstoss | 257/436 |
| 2007/0298533 | A1 * | 12/2007 | Yang et al. | 438/57 |

FOREIGN PATENT DOCUMENTS

CN 101019233 A 8/2007

* cited by examiner

*Primary Examiner* — Tony Ko

(74) *Attorney, Agent, or Firm* — Muncy, Geissler, Olds & Lowe, PLLC

(57) ABSTRACT

An image sensor device is disclosed. The image sensor device includes a semiconductor substrate having a first pixel region and a second pixel region. A first photo-conversion device is disposed within the first pixel region of the semiconductor substrate to receive a first light source. A second photo-conversion device is disposed within the second pixel region of the semiconductor substrate to receive a second light source different from the first light source. The surface of the semiconductor substrate corresponding to the first photo-conversion device and the second photo-conversion device has a first microstructure and a second microstructure, respectively, permitting a reflectivity of the first pixel region with respect to the first light source to be lower than a reflectivity of the second pixel region with respect to the first light source. The invention also discloses a fabrication method of the image sensor device.

21 Claims, 2 Drawing Sheets

IMAGE SENSOR DEVICE WITH SILICON MICROSTRUCTURES AND FABRICATION METHOD THEREOF

BACKGROUND OF THE INVENTION

1. Field of the Invention

The invention relates to an optoelectronic device and more particularly to a structure of an image sensor device and a method for fabricating the same.

2. Description of the Related Art

As optoelectronic applications, such as digital cameras, digital video recorders, image capture capable mobile phones and monitors, become more and more popular, the demand for image sensor devices accordingly increase. An image sensor device is used for recording a photo signal from an image and converting the photo signal into an electronic signal. After recording and processing the electronic signal, a digital image is generated. In general, image sensor devices can be categorized into two main types, one is charge coupled devices (CCD) and the other complementary metal oxide semiconductor (CMOS) devices.

FIG. 1 shows a cross section of a conventional CMOS type image sensor device 10. The image sensor device 10 typically comprises a pixel array formed on a silicon substrate 100. Each pixel includes a photo-conversion device 101, such as a photodiode, formed within the corresponding pixel region of the silicon substrate 100, so as to produce a signal corresponding to the intensity of light impinging thereon. Here, only four pixel regions 100*a*, 100*b*, 100*c*, and 100*d* are depicted. When a light source is focused on the array, signals can be employed to display a corresponding image. A microlens array 106 is correspondingly disposed above the pixel array and used for focusing light onto the pixel array. A color filter array 104 is correspondingly interposed between the pixel array and microlens array 106. Each color filter allows light with particular wavelengths to pass the respective photo-conversion device 101. An intervening layer 102 is between the color filter array 104 and the silicon substrate 100, which includes interconnections (not shown) to form electrical connection between the devices of the pixel array and between the pixel array and the peripheral circuit (not shown) of the pixel array.

However, a large amount of incident light (not shown) is reflected from the silicon substrate 100 and cannot be absorbed efficiently by the photo-conversion devices 101 due to the smooth surface of the silicon substrate. Thus, the intensity of the incident light to each pixel/photo-conversion device is reduced. The reduced light intensities may enhance cross-talk of pixels, resulting in reduction of the signal to noise ratio (SNR) and photosensitivity of the image sensor device.

Therefore, there is a need to develop a novel design for a pixel array capable of enhancing quantum efficiency of pixels and reducing cross-talk of pixels.

BRIEF SUMMARY OF THE INVENTION

A detailed description is given in the following embodiments with reference to the accompanying drawings. An image sensor device and a fabrication method thereof are provided. An embodiment of an image sensor device comprises a semiconductor substrate having a first pixel region and a second pixel region. A first photo-conversion device is disposed within the first pixel region of the semiconductor substrate to receive a first light source. A second photo-conversion device is disposed within the second pixel region of the semiconductor substrate to receive a second light source different from the first light source. The surface of the semiconductor substrate corresponding to the first photo-conversion device and the second photo-conversion device has a first microstructure and a second microstructure, respectively, permitting a reflectivity of the first pixel region with respect to the first light source to be lower than a reflectivity of the second pixel region with respect to the first light source.

An embodiment of a method for fabricating an image sensor device comprises providing a semiconductor substrate having a first pixel region and a second pixel region. A first photo-conversion device is formed within the first pixel region of the semiconductor substrate to receive a first light source. A second photo-conversion device is formed within the second pixel region of the semiconductor substrate to receive a second light source different from the first light source. A first microstructure and a second microstructure are formed on the surface of the semiconductor substrate corresponding to the first photo-conversion device and the second photo-conversion device, respectively, to permit a reflectivity of the first pixel region with respect to the first light source to be lower than a reflectivity of the second pixel region with respect to the first light source.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims.

Figure 1:
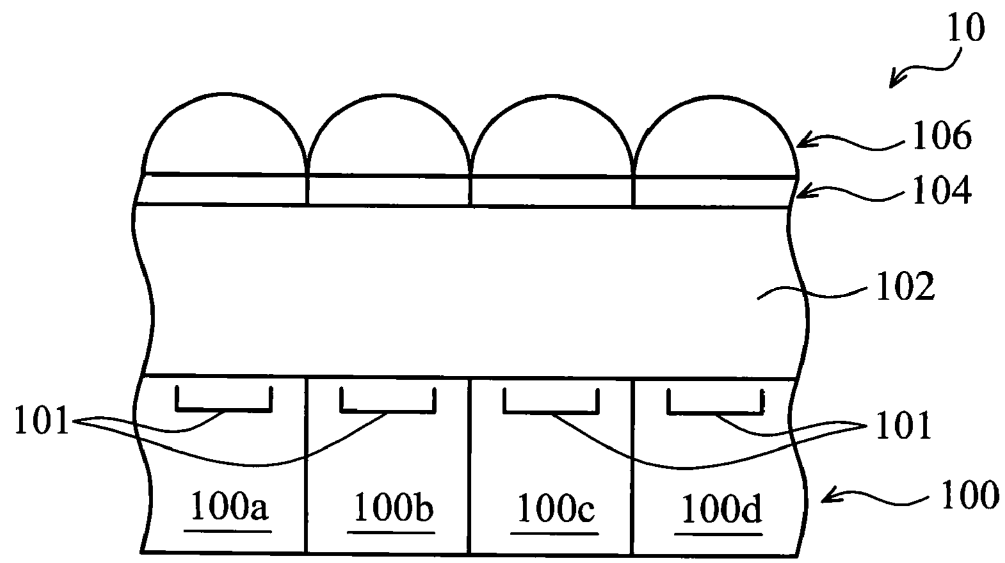
FIG. 1 is a cross section of a conventional image sensor device.
Figure 2:
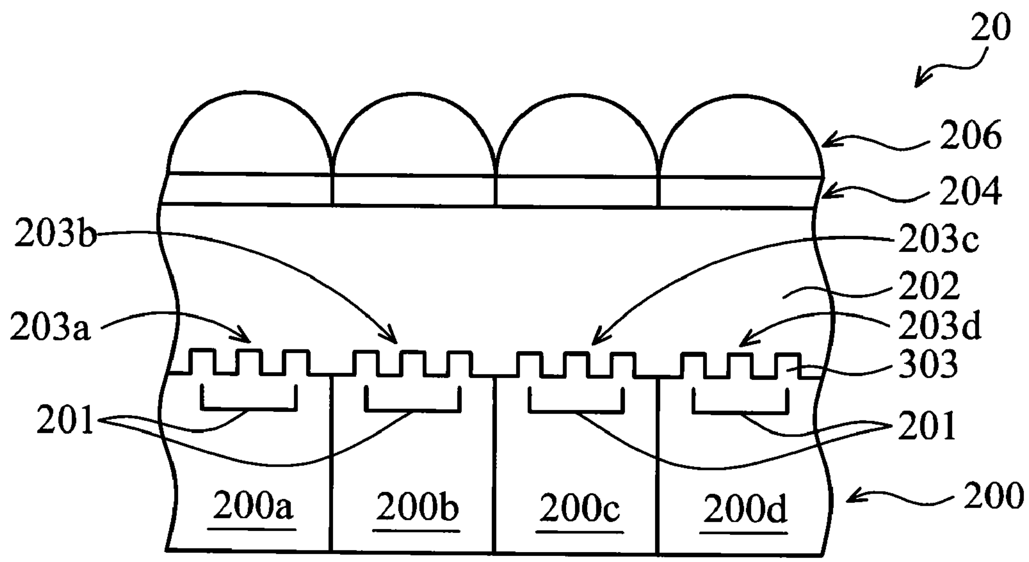
FIG. 2 is a cross section of an embodiment of image sensor device with microstructures according to the invention.

Referring to FIG. 2, which is an exemplary embodiment of an image sensor device with microstructures according to the invention. The image sensor device 20 comprises a semiconductor substrate 200 having pixel regions for formation of a pixel array thereon. In order to simplify the diagram and the description, only four pixel regions 200*a*, 200*b*, 200*c*, and 200*d* are depicted. In the embodiment, the semiconductor substrate 200 may be a bulk silicon substrate or other semiconductor substrates comprising silicon, germanium, carbon, or combinations thereof. Moreover, each pixel may comprise a photo-conversion device 201, such as a photodiode, disposed within the corresponding pixel region 200*a*, 200*b*, 200*c*, or 200*d* of the semiconductor substrate 200, so as to receive a light source with particular wavelengths and produce an electronic signal corresponding to intensity of light impinging thereon.

An intervening layer 202 is disposed on the semiconductor substrate 200. The intervening layer 202 may comprise a single layer or a multi-layer structure. In the embodiment, the intervening layer 202 may be composed of a multilayered structure comprising, for example, an interlayer dielectric (ILD) layer/intermetal dielectric (IMD) layer and an overlying passivation or planarization layer, in which the ILD/IMD layer includes interconnections (not shown) to form electrical connection between the devices of the pixel array and between the pixel array and the peripheral circuit (not shown) of the pixel array. In order to simply the diagram, only a flat intervening layer 202 is depicted. Moreover, the intervening layer 202 may comprise silicon oxide, silicon nitride or combinations thereof.

A color filter array 204 is disposed on the intervening layer 202. A microlens array 206 is disposed on the color filter array 204 above the intervening layer 202. The microlens array 206 includes microlenses correspondingly associated with the pixels in the pixel array. Note that although the intervening layer 202 shown in FIG. 2 is interposed between the semiconductor substrate 200 and the color filter array 204, the intervening layer 202 may also be disposed under the semiconductor substrate 200 in other embodiments for a backside illuminated type image sensor device.

In the embodiment, the photo-conversion devices 201 within the respective pixel regions 200*a*, 200*b*, 200*c*, and 200*d* are utilized to receive light sources with different wavelengths. In particular, the surface of the semiconductor substrate 200 corresponding to the photo-conversion devices 201 within the respective pixel regions 200*a*, 200*b*, 200*c*, and 200*d* have microstructures 203*a*, 203*b*, 203*c*, and 203*d*, respectively. These microstructures 203*a*, 203*b*, 203*c*, and 203*d* may comprise a plurality of islands 303, respectively, formed of the semiconductor substrate 200. These micro-islands 303 can effectively reduce the reflection of the incident light, thereby increasing light absorption of the semiconductor substrate 200. Thus, the intensity of the incident light to each pixel/photo-conversion device 201 can be maintained or increased.

Moreover, in the embodiment, the microstructures 203*a*, 203*b*, 203*c*, and 203*d* may permit a reflectivity in the respective pixel regions 200*a*, 200*b*, 200*c*, and 200*d* with respect to the same light source to be different from each other. In particular, for example, the photo-conversion device 201 within the pixel region 200*a* is utilized to receive a first light source (e.g. blue light) and the photo-conversion devices 201 within the respective pixel regions 200*b*, 200*c*, and 200*d* are utilized to receive a second, a third, and a fourth light sources different from the first light source. The microstructure 203*a* permits a reflectivity of the pixel region 200*a* with respect to the first light source to be lower than reflectivityes of the respective pixel regions 200*b*, 200*c*, and 200*d* with respect to the first light source. Also, the microstructure 203*b* permits a reflectivity of the pixel region 200*b* with respect to the second light source to be lower than reflectivityes of the respective pixel regions 200*a*, 200*c*, and 200*d* with respect to the second light source, and so on. Additionally, the microstructure 203*a* may permit a reflectivity of the pixel region 200*a* with respect to the first light source to be close or equal to the reflectivity of the pixel region 200*a* with respect to the second, third, or fourth light source. Also, the microstructure 203*b* may permit a reflectivity of the pixel region 200*b* with respect to the second light source to be close or equal to the reflectivity of the pixel region 200*b* with respect to the first, third, or fourth light source, and so on.

Figure 3A:
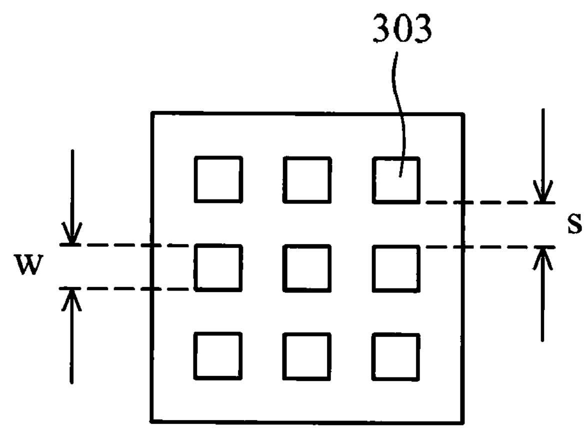
FIGS. 3A-3C are plan views of various exemplary embodiments of a microstructure design for a pixel region according to the invention.
Figure 3B:
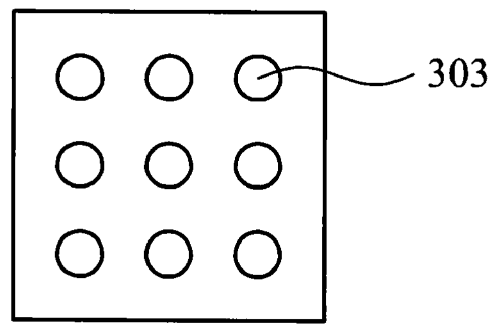
Figure 3C:
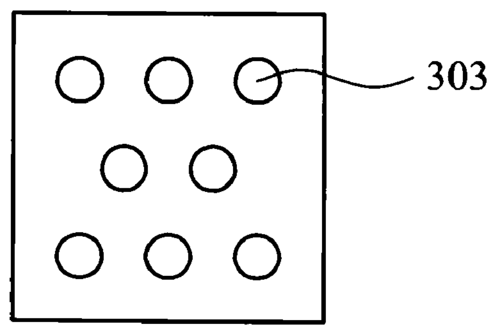

Referring to FIGS. 3A-3C, which illustrate various exemplary embodiments of a microstructure design for a pixel region according to the invention. In FIG. 3A, the plurality of islands 303 of the microstructure are formed within a pixel region with a pixel size of about 1.4 μm and are arranged in a 3×3 array. Note that the number of the islands 303 are based on design demands and is not limited to that shown in FIG. 3A. In one embodiment, each island 303 is rectangular-shaped from a top view, as shown in FIG. 3A. Moreover, each island 303 of the microstructure 203*a* may have an island width w that is different from that of each island 303 of the other microstructures 203*b*, 203*c*, and 203*d*. Table 1 shows the measurements of the reflectivity of the surface of the semiconductor substrate having microstructures with two different island widths and that of the reflectivity of the surface of the semiconductor substrate without having microstructures with respect to red, green, and blue light sources:

TABLE 1

| Island width (μm) | R-light (Reflectivity) | G-light (Reflectivity) | B-light (Reflectivity) |
|---|---|---|---|
| 0.2 | 22% | 7% | 7% |
| 0.25 | 4% | 3% | 12% |
| 0 (no microstructures) | 34% | 37% | 42% |

As shown in Table 1, the surface of the semiconductor substrate having microstructures can effectively reduce the reflectivity compared to the surface of the semiconductor substrate without having microstructures. Moreover, the optimum island width w of the microstructures for the pixel regions receiving specified light sources can be determined by the relative reflectivity. For example, since the reflectivity of the microstructure with an island width of 0.2 μm with respect to the blue light source is equal to that with respect to the green light source and is lower than that with respect to the red light source, a microstructure with an island width w of 0.2 μm is preferably formed within the pixel region for receiving a cyan (which is a complementary color of red) light source. Additionally, since the reflectivity of the microstructure with an island width of 0.25 μm with respect to the red light source is close to that with respect to the green light source and is lower than that with respect to the blue light source, a microstructure with an island width w of 0.25 μm is preferably formed within the pixel region for receiving a yellow (which is a complementary color of blue) light source.

In another embodiment, each island 303 is rectangular-shaped from a top view, as shown in FIG. 3A. Moreover, the microstructure 203*a* may have an island spacing s that is different from that of the other microstructures 203*b*, 203*c*, and 203*d*. Table 2 shows the measurements of the reflectivity of the surface of the semiconductor substrate having microstructures with two different island spacing with respect to red, green, and blue light sources:

TABLE 2

| Island spacing (μm) | R-light (Reflectivity) | G-light (Reflectivity) | B-light (Reflectivity) |
|---|---|---|---|
| 0.35 | 20% | 19% | 5% |
| 0.38 | 12% | 21% | 19% |

As shown in Table 2, the optimum island spacing s of the microstructures for the pixel regions receiving specified light sources can be determined by the relative reflectivity. For example, the reflectivity of the microstructure with island spacing of 0.35 μm with respect to the blue light source is lower than that with respect to the red and green light sources. Accordingly, a microstructure with island spacing of 0.35 μm is preferably formed within the pixel region for receiving a blue light source to obtain better light-absorption efficiency than that formed within other pixel regions for receiving a red or green light source. Additionally, a microstructure with island spacing of 0.38 μm is preferably formed within the pixel region for receiving a red light source.

In one embodiment, the microstructures formed within the pixel regions for receiving different light sources may have different island shapes from a top view. For example, the island shape may be circular, as shown in FIG. 3B, or square-shaped, and hexagonal-shaped. Also, the optimum island shape from a top view of the microstructures for the pixel regions receiving specified light sources can be determined by the relative reflectivity. In another embodiment, the plurality of islands 303 of the microstructures formed within the pixel regions for receiving different light sources may have different island arrangements from each other. FIG. 3C shows an exemplary island arrangement where at least two rows of the plurality of islands 303 of the microstructure have different island arrangements. Also, the optimum island arrangement for the pixel regions receiving different light sources can be determined by the relative reflectivity.

Referring to FIG. 2, the image sensor device 20 is fabricated by the following steps. In the initial step, a semiconductor substrate 200 having pixel regions 200*a*, 200*b*, 200*c*, and 200*d* is provided. In the embodiment, the semiconductor substrate 200 may be a bulk silicon substrate or other semiconductor substrates comprising silicon, germanium, carbon, or combinations thereof. In the next step, photo-conversion devices 201 are formed within the respective pixel regions 200*a*, 200*b*, 200*c*, and 200*d* of the semiconductor substrate 200 to receive the respective light sources (not shown) by well-known photo-conversion device fabrication. In the embodiment, in particular, during formation of photo-conversion devices 201, microstructures 203*a*, 203*b*, 203*c*, and 203*d* are formed on the surface of the semiconductor substrate 200 corresponding to the photo-conversion devices 201, respectively, by performing a lithography process on the surface of the semiconductor substrate 200 and followed by performing an etching process thereon, to permit a reflectivity in the respective pixel regions 200*a*, 200*b*, 200*c*, and 200*d* with respect to the same light source to be different from each other. In particular, one of the microstructures 203*a*, 203*b*, 203*c*, and 203*d* permits a reflectivity of the corresponding pixel region 200*a*, 200*b*, 200*c*, or 200*d* with respect to the specified light source to be lower than reflectivityes of the other pixel regions with respect to the same light source, as mentioned above. Additionally, one of the microstructures 203*a*, 203*b*, 203*c*, and 203*d* may permit a reflectivity of the corresponding pixel region 200*a*, 200*b*, 200*c*, or 200*d* with respect to the specified light source to be close or equal to that with respect to another specified light source.

According to the mentioned embodiments, since each pixel region has a microstructure formed on the surface of the semiconductor substrate, the reflectivity can be effectively reduced to improve light-absorption efficiency. Besides, due to high absorption, the optical path in semiconductor is reduced and thus improves the cross-talk of pixels. Namely, the signal to noise ratio (SNR) and photosensitivity of the image sensor device can be increased. Moreover, since the microstructures are formed by lithography and etching processes, the desired microstructure design can be accomplished. Namely, optimum light-absorption efficiency or quantum efficiency for each pixel in the pixel array can be obtained.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensor device, comprising:

a semiconductor substrate having a first pixel region and a second pixel region;

a first photo-conversion device disposed within the first pixel region of the semiconductor substrate to receive a first light source; and a second photo-conversion device disposed within the second pixel region of the semiconductor substrate to receive a second light source different from the first light source, wherein the surface of the semiconductor substrate corresponding to the first photo-conversion device and the second photo-conversion device has a first microstructure and a second microstructure, respectively, permitting a reflectivity of the first pixel region with respect to the first light source to be lower than a reflectivity of the second pixel region with respect to the first light source.

2. The image sensor device as claimed in claim 1, wherein the first microstructure and the second microstructure permit a reflectivity of the second pixel region with respect to the second light source to be lower than a reflectivity of the first pixel region with respect to the second light source.

3. The image sensor device as claimed in claim 1, wherein the first microstructure permits a reflectivity of the first pixel region with respect to the second light source to be equal to the reflectivity of the first pixel region with respect to the first light source.

4. The image sensor device as claimed in claim 1, wherein the second microstructure permits a reflectivity of the second pixel region with respect to the second light source to be equal to a reflectivity of the second pixel region with respect to a third light source different from the first and second light sources.

5. The image sensor device as claimed in claim 1, wherein the first and second microstructures comprise a plurality of islands, respectively, formed of the semiconductor substrate.

6. The image sensor device as claimed in claim 5, wherein each island is rectangular-shaped from a top view and each island of the first microstructure has a width different from that of each island of the second microstructure.

7. The image sensor device as claimed in claim 5, wherein the first microstructure has an island spacing different from that of the second microstructure.

8. The image sensor device as claimed in claim 5, wherein each island of the first microstructure has a shape from a top view that is different from that of each island of the second microstructure.

9. The image sensor device as claimed in claim 5, wherein the plurality of islands of the first microstructure has an arrangement that is different from that of the plurality of islands of the second microstructure.

10. The image sensor device as claimed in claim 1, wherein the semiconductor substrate comprises silicon.

11. A method for fabricating an image sensor device, comprising:

providing a semiconductor substrate having a first pixel region and a second pixel region;

forming a first photo-conversion device within the first pixel region of the semiconductor substrate to receive a first light source; and forming a second photo-conversion device within the second pixel region of the semiconductor substrate to receive a second light source different from the first light source, wherein a first microstructure and a second microstructure are formed on the surface of the semiconductor substrate corresponding to the first photo-conversion device and the second photo-conversion device, respectively, to permit a reflectivity of the first pixel region with respect to the first light source to be lower than a reflectivity of the second pixel region with respect to the first light source.

12. The method as claimed in claim 11, wherein the first and second microstructures are formed by performing a lithography process on the surface of the semiconductor substrate and followed by performing an etching process thereon.

13. The method as claimed in claim 11, wherein the first microstructure and the second microstructure permit a reflectivity of the second pixel region with respect to the second light source to be lower than a reflectivity of the first pixel region with respect to the second light source.

14. The method as claimed in claim 11, wherein the first microstructure permits a reflectivity of the first pixel region with respect to the second light source to be equal to the reflectivity of the first pixel region with respect to the first light source.

15. The method as claimed in claim 11, wherein the second microstructure permits a reflectivity of the second pixel region with respect to the second light source to be equal to a reflectivity of the second pixel region with respect to a third light source different from the first and second light sources.

16. The method as claimed in claim 11, wherein the first and second microstructures comprise a plurality of islands, respectively, formed the semiconductor substrate.

17. The method as claimed in claim 16, wherein each island is rectangular-shaped from a top view and each island of the first microstructure has a width different from that of each island of the second microstructure.

18. The method as claimed in claim 16, wherein the first microstructure has an island spacing different from that of the second microstructure.

19. The method as claimed in claim 16, wherein each island of the first microstructure has a shape from a top view that is different from that of each island of the second microstructure.

20. The method as claimed in claim 16, wherein the plurality of islands of the first microstructure has an arrangement that is different from that of the plurality of islands of the second microstructure.

21. The method as claimed in claim 11, wherein the semiconductor substrate comprises silicon.

* * * * *